United States Patent [19]

Przybysz

[11] Patent Number: 5,069,748
[45] Date of Patent: Dec. 3, 1991

[54] METHOD FOR FORMING REFRACTORY RESISTORS WITH ETCH STOP FOR SUPERCONDUCTOR INTEGRATED CIRCUITS

[75] Inventor: John X. Przybysz, Penn Hills, Pa.

[73] Assignee: Westinghouse Electric Corp., Pittsburgh, Pa.

[21] Appl. No.: 644,131

[22] Filed: Jan. 22, 1991

Related U.S. Application Data

[62] Division of Ser. No. 359,018, May 30, 1989, Pat. No. 5,021,867.

[51] Int. Cl.⁵ .......................... B44C 1/22; C23F 1/02
[52] U.S. Cl. ................................... 156/643; 156/646; 156/652; 156/656; 156/659.1; 427/38; 427/63; 427/102; 427/103; 437/192; 437/246; 505/820
[58] Field of Search ............... 156/643, 646, 650, 652, 156/656, 659.1, 661.1, 662, 664; 204/192.21, 192.24, 192.32, 192.35; 427/62, 38, 63, 96, 102, 103; 338/32 S, 307, 308, 311; 505/1, 816, 728, 817, 922, 820, 923; 29/610.1, 620; 437/190, 192, 246; 357/5, 65, 71

[56] References Cited

U.S. PATENT DOCUMENTS 4,439,269  3/1984  Cukauskas ............... 437/190 X
4,904,619  2/1990  Yamada et al. .................. 437/190
4,904,980  2/1990  Przybysz et al. ............. 427/103 X
4,913,769  4/1990  Kanda et al. ...................... 427/63
4,981,816  1/1991  Kim et al. ......................... 437/189

Primary Examiner—William A. Powell
Attorney, Agent, or Firm—R. P. Lenart

[57] ABSTRACT

This is a structure of, and method for preparation of, molybdenum resistors in a superconductor integrated circuit. It utilizes a pattern superconductor film; applying a titanium film on the patterned superconductor film; and then applying a molybdenum film on the titanium film to provide a titanium-molybdenum, etch-stop interface; applying a patterned resist film on the molybdenum film; etching the exposed molybdenum film to expose a portion of the titanium-molybdenum, etch-stop interface; and oxidizing the exposed titanium-molybdenum, etch-stop interface. The titanium-molybdenum etch stop interface protects the patterned superconductor film and the support (including any other underlayers) and increases processing margins for the etch time. Preferably the etching of the exposed molybdenum film is by reactive ion etching and oxidizing the exposed titanium-molybdenum etch stop interface is by exposing the interface to a plasma containing about 25–75 volume percent oxygen and 25–75 volume percent argon, and the titanium film is about 50–500 Angstroms thick.

10 Claims, 2 Drawing Sheets

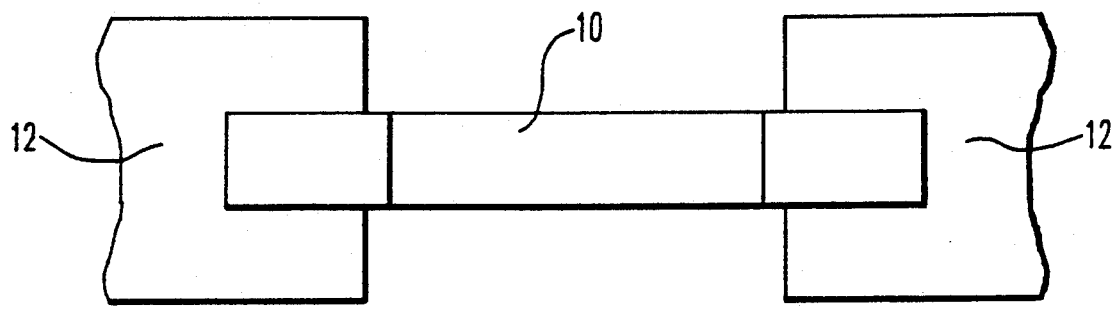
FIG. IA
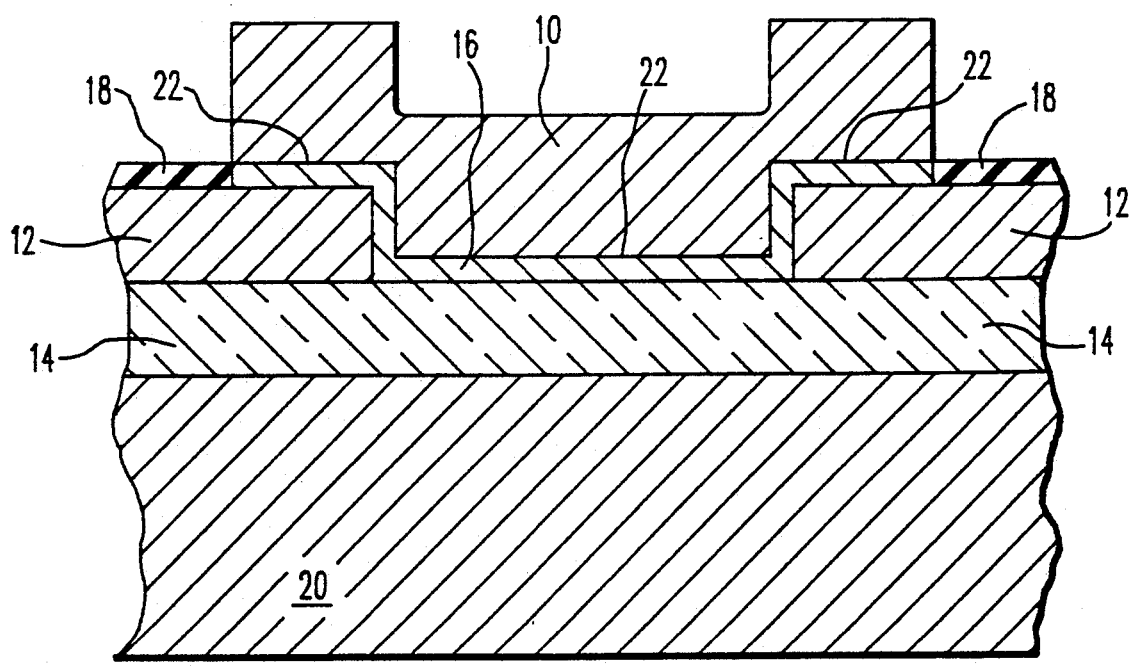
FIG. IB

METHOD FOR FORMING REFRACTORY RESISTORS WITH ETCH STOP FOR SUPERCONDUCTOR INTEGRATED CIRCUITS

This is a division of application Ser. No. 07/359,018 filed May 30, 1989, now U.S. Pat. No. 5,021,867.

CROSS-REFERENCE TO RELATED APPLICATION

A method and article using an aluminum etch stop for resistors is described in related U.S. Pat. No. 4,904,980. That related process can also be used, in conjunction with the process described herein, during the manufacturing of superconductor integrated circuitry, except the instant invention utilizes a titanium, rather than an aluminum, etch stop (as a result the problem of the aluminum etch stop, even when quite thin, providing a relatively low resistance in parallel with the molybdenum resistor, is generally avoided in the instant invention).

A process for etching insulators (e.g. silicon dioxide insulators) using a nitrogen trifluoride in argon etching is described in related U.S. Pat. No. 4,904,341. That related process can also be used, in conjunction with the process described herein, during the manufacturing of superconductor integrated circuitry.

A superconducting digital logic amplifier for interfacing between a low voltage Josephson junction logic circuit and a higher voltage semiconductor circuit input is described in U.S. Pat. No. 4,859,879. That amplifier uses a first series string of at least three lower critical current Josephson junctions (e.g. about 0.5 milliamp) connected in series with an input Josephson junction to provide a series combination and a second series string of at least four higher critical current (e.g. about 1.5 milliamp) Josephson junctions connected in parallel with the series combination to provide parallel strings having an upper common connection connected to the output terminal. A pulsed DC current source is connected to the parallel strings at the upper common connection. During a pulse from the DC current source a, signal on the amplifier input exceeds the critical current of the input Josephson junction, which in turn causes the critical current of the other Josephson junctions in the amplifier to be exceeded, causing a higher power pulse on the output terminal during the remainder of the pulse from the current source. By using an appropriate number of junctions in the series strings, a low power signal from a Josephson logic circuit is raised, by the logic amplifier, to a power appropriate to drive a conventional semiconductor circuit.

BACKGROUND OF THE INVENTION

1. Field of the Invention

This invention relates to superconductor integrated circuits, and in particular provides an etch stop for the etching of molybdenum resistors in superconductor integrated circuits.

2. Description of Related Art

Superconductor integrated circuits using Josephson tunnel junction devices have been described in a number of U.S. Pat. Nos. (e.g. 4,430,662 issued Feb. 7, 1984 and 4,554,567 issued Nov. 19, 1985, both to Jillie and Smith and both describing integrated circuitry and methods of manufacture, Josephson junction device configurations are also shown in U.S. Pat. Nos. 4,423,430 issued Dec. 27, 1983 to Hasuo et al. and 4,421,785 issued Dec. 20, 1983 to Kroger). The usage of molybdenum resistors is described, for example, in U.S. Pat. No. 4,609,903 issued Sept. 2, 1986 to Toyokura et al. U.S. Pat. No. 4,498,228, issued Feb. 12, 1985, to Jillie and Smith discloses a method of manufacturing a Josephson junction integrated circuit including the step of depositing and patterning the resistor material, which typically may be molybdenum, approximately 800 angstroms thick and also having an insulator layer comprising silicon dioxide, approximately 2500 angstroms thick. Jillie et al. note that the first layer of deposited insulator provides an etch stop for the upper niobium etch step. A paper by S. Kosaka et al. entitled "An Integration of All Refractory Josephson Logic LSI Circuit", (IEEE Transactions On Magnetics, volume MAG-21, No. 2, March 1985, pp. 102-109) provides several examples of etch stop by chemical selectivity, i.e., the layer being etched has a much higher etch rate than the layers underneath.

SUMMARY OF THE INVENTION

It has been discovered that a titanium to molybdenum, metal to metal interface provides an extremely effective etch stop. This is apparently a new type of etch stop (in which an etchant etches either of the materials individually at relatively rapid rates, but does not appreciably etch the interface between the two in normal processing times). Although the reason why the titanium-molybdenum metal to metal interface acts as an etch stop is not known, this has proved to be an extremely effective etch stop. As the interface and the titanium underneath the interface remain metallic during the etching (and thus would short out the circuitry if allowed to remain metallic), the interface and the titanium are oxidized after etching. The unusual properties of the interface are further illustrated by the fact that individually, the titanium film or the few monolayers of molybdenum are separately easily oxidized, but it has been found that relatively powerful oxidizing is required for the two when combined in the manner of this invention (thus after etching, relatively powerful oxidizing must be used to convert the few monolayers of molybdenum and the titanium film to oxide).

This invention is a method for preparing, molybdenum resistors in a superconductor integrated circuit the method by depositing superconductor film on a support; patterning the superconductor film; applying a titanium film on the superconductor film; applying a molybdenum film on the titanium film to provide material for the resistor and a titanium-molybdenum etch stop interface; applying a patterned resist film on the molybdenum film to provide exposed molybdenum film and unexposed molybdenum film; etching the exposed molybdenum film down to, and thus exposing a portion of, the titanium-molybdenum etch stop interface and defining the resistor; and oxidizing the exposed titanium-molybdenum, etch-stop interface. The titanium-molybdenum, etch-stop interface protects the patterned superconductor film and any other underlayers and increases processing margins for the etch time. The resistivities of zirconium and hafnium are only slightly less than that of titanium, and although titaniun is greatly preferred and will be used in the discussion, zirconium and/or hafnium can apparently be substituted in whole or in part for the titanium.

Preferably the etching of the exposed molybdenum film is by reactive ion etching or plasma etching (and most preferably by reactive ion etching) and oxidizing the exposed titanium-molybdenum etch stop interface is by exposing the interface to a plasma containing at least 25 volume percent oxygen (most preferably the plasma contains 25-75 volume percent oxygen and 25-75 volume percent argon) and the titanium film is 50-500 Angstroms thick (most preferably the titanium film is about 200 Angstroms thick).

The molybdenum resistor configuration for a superconductor integrated circuit comprises: a support; areas of superconductor film covering portions of the support; a 50-500 Angstrom thick titanium film on the areas of superconductor film; a titanium-molybdenum etch stop interface on the titanium film; a molybdenum film on the titanium-molybdenum etch stop interface; and a titanium oxide film on the support, covering portions of the support not covered by the areas of superconductor film. Preferably, the titanium film is about 150-250 Angstroms thick.

A related process described in U.S. Pat. No. 4,904,980 uses aluminum during the manufacturing of superconductor integrated circuitry, while the instant invention utilizes a titanium, rather than an aluminum etch stop. Titanium has a resistivity of about twenty times that of aluminum, and, as a result, the problem of even a quite thin aluminum etch stop providing a relatively low resistance in parallel with the molybdenum resistor, is generally avoided and, with titanium, a thicker layer can be used, thus giving a larger processing tolerance.

BRIEF DESCRIPTION OF THE DRAWINGS

This invention can be best understood by reference to the following drawings in which:

FIGS. 1A and 1B are diagrams of the structure of the molybdenum resistor configuration.

DESCRIPTION OF THE PREFERRED EMBODIMENTS

Figure 2:
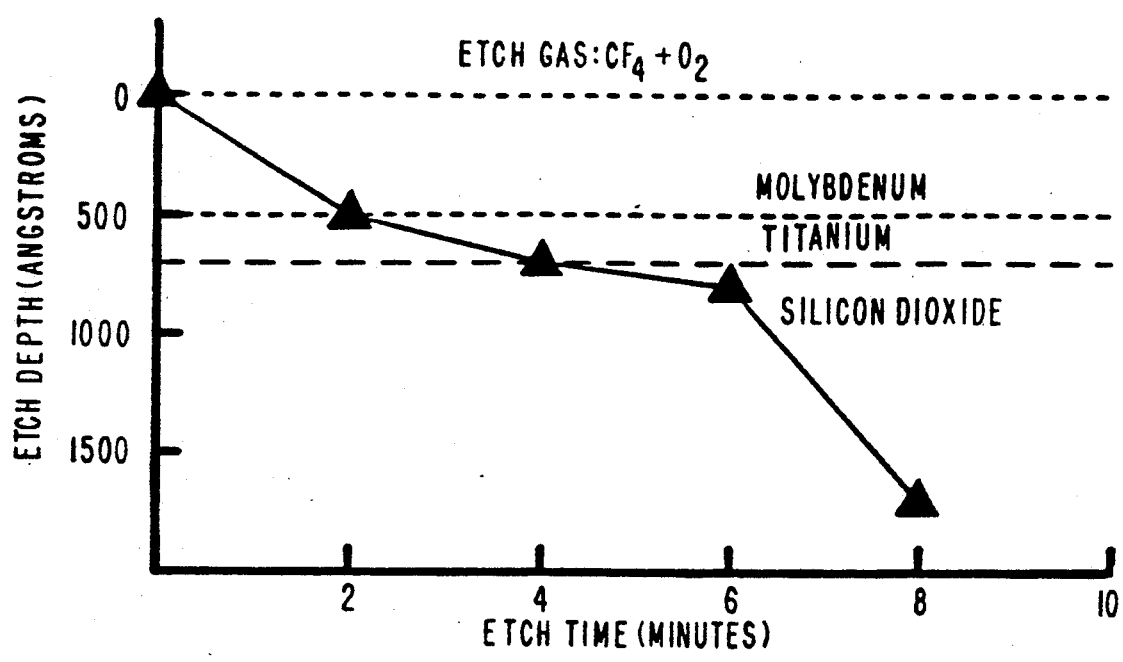
FIG. 2 shows depth versus reactive ion etch time for a molybdenum resistor film on top of a titanium film over silicon dioxide.

This invention provides a process for preparing molybdenum resistors and a superconductor integrated circuit.

Superconductor integrated circuits are desired for high speed signal processing. Josephson electronics has the potential for 100 GHz integrated receivers.

Circuits made from refractory materials have the highest reliability. Josephson junctions and superconducting interconnections can be made from niobium or niobium nitride. Resistor films made from 3000 Angstroms of molybdenum provide a sheet resistivity of 0.6 ohms per square, which is a desirable value for X-band digital logic circuits.

Typically, molybdenum films are sputter deposited, then patterned by reactive ion etching, since sputtered molybdenum is not suitable for liftoff. Problems arise in processing because sputtered films are not uniform in thickness. Even if the films could be made uniformly thick, the reactive ion etch process tends to etch faster at the edge of a wafer than in the center of a wafer. Hence, it is necessary to overetch some areas of the wafer, to allow time for the pattern to become fully defined in the slower portions of the wafer. This can cause undesirable attacks on the silicon dioxide and niobium underlayers that are exposed when the molybdenum is etched away. Chips at the edge of a wafer have been destroyed when the $CF_4 + O_2$ plasma etched off the niobium interconnects before the molybdenum resistors on chips in the center of the wafer were completely defined.

The structure and a method of this invention fabricates molybdenum resistors with an etch stop layer to protect underlayers of niobium and silicon dioxide. The etch stop action is provided by a thin layer of titanium, (e.g. approximately 200 Angstroms thick) which is sputtered in-situ, just prior to the molybdenum deposition.

The structure of the new resistors is shown in FIGS. 1A and 1B. The resistor film 10 is made of molybdenum. The superconductor film 12 contacts are shown made of niobium (other superconductor materials can be substituted as known in the art). This structure is shown sitting on top of a layer of silicon dioxide 14. Generally the structure is on a support 20 (which for these purposes can include the layer 14 and can include other circuit components). Beneath the resistors is a thin layer of about 200 Angstroms of titanium 16. Areas of niobium and silicon dioxide that are not underneath the resistors are covered by a thin layer of oxidized titanium 18. The titanium-molybdenum, etch-stop interface 22 provides for better yield and improved circuits (by providing more uniform layers, for example, microwave properties are improved).

Resistors have been fabricated and tested. All the films were deposited by sputtering and patterned by reactive ion etching; plasma etching generally can be used. After the silicon dioxide and the niobium films had been deposited and patterned, the wafer was coated with 200 Angstroms of titanium, followed by 3000 Angstroms of molybdenum.

Resistors were patterned by photoresist and reactive ion etched in a plasma of $CF_4 + O_2$. Gas flow rates were 12.4 sccm of $CF_4$ and 1 sccm of $O_2$. Chamber pressure was 75 mT. Power density was 0.5 w/cm² of 13 MHz rf power. After 10 minutes, the molybdenum had been etched down to the etch stop layer.

Then the etch stop layer was oxidized in a plasma of oxygen and argon. The gas flow rates were 11.5 sccm of Argon and 8 sccm of oxygen. Chamber pressure was 75 mT and rf power density was 0.75 W/cm². The etch stop layer (interface) was oxidized for two minutes. The addition of the argon gas to the plasma provided high energy ions to churn and mix the etch stop layer, to expose all of the metal to the oxidizing plasma.

Problems had arisen in the use of the aluminum etch stop due to the disparity in the resistivities of Al and molybdenum at 4.2 kelvin. Even a thin layer of 30 Angstroms of Al was highly conductive. By itself, a 3000 Angstrom layer of sputtered molybdenum had a sheet resistance of about 0.45 ohm. With 30 Angstroms of Al under 3000 Angstroms of molybdenum, the sheet resistance was about 0.04 ohm. The conductance of the Al dominated the conductance of the bimetal film. In effect, the aluminum film can short out the molybdenum film. Furthermore, slight changes in Al thickness caused large changes in film thickness.

An improved etch stop layer for use under molybdenum films has been found. A layer of titanium acted as an etch stop for reactive ion etching of molybdenum. Since titanium has a similar resistivity to molybdenum, the film resistivity should not depend critically on the Ti thickness. Furthermore, thicker etch stop layers can be employed, without reducing the sheet resistance below the desired value. Generally the film is greater than 50 Angstroms thick (preferably it is less than 500 Angstroms thick, and most preferably between 150-250

Angstroms thick). The effectiveness of Ti as an etch stop under molybdenum was demonstrated by sputtering 200 Angstroms of Ti on to a thermally oxidized silicon substrate, followed by 500 Angstroms of molybdenum. The molybdenum thickness was made smaller than the usual 3000 Angstroms to more accurately measure the progress of the etch through the etch stop layer. The Tallystep measures etch depths with respect to the original surface, and it is easier to accurately measure small etch depths.

The action of the etch stop layer (interface) is illustrated in FIG. 2. The wafer was etched in a $CF_4+O_2$ plasma for 2, 4, 6, and 8 minutes. Gas flow rates were 12.4 sccm of $CF_4$ and 1 sccm of $O_2$. Chamber pressure was 75 mT. Power density was 0.5 w/cm$^2$ of 13 MHz rf power. The etch depths were measured with a Tallystep profilometer.

After 2 minutes, the etch had reached the etch stop layer. At 6 minutes of etching time, the etch stop layer was still protecting the $SiO_2$ layer underneath. At 8 minutes, the etch stop was exhausted and the RIE was attacking the $SiO_2$. These results show that the Ti layer provides at least 4 minutes of protection for underlayers. This allows additional time to complete the chips at the center of a wafer, while protecting the chips at the edge.

Resistors were fabricated with a Ti etch stop layer under molybdenum. As in the previous invention, the etch stop layer was oxidized in a plasma of oxygen and argon. The gas flow rates were 11.5 sccm of Ar and 8 sccm of oxygen. Chamber pressure was 75 mT and rf power density was 0.75 W/cm$^2$. The etch stop layer was oxidized for two minutes. The addition of the argon gas to the plasma provided high energy ions to churn and mix the etch stop layer, to expose all of the metal to the oxidizing plasma.

The sheet resistivity of the fabricated resistors measured 0.66 ohm. Since sputtered Ti films have a higher sheet resistivity than sputtered molybdenum films, the resistance of the bilayer film was not degraded by the etch stop.

These results, and other tests with titanium under niobium, indicate that the etch stop is due to the interaction of the titanium layer with the metal layer above it. Titanium by itself will not stop the etch plasma. But titanium with molybdenum on top of it will act as a very effective etch stop. The measurements in FIG. 3 even indicate that the molybdenum was not completely removed in the etching. Some sort of alloy layer or interface layer containing both titanium and molybdenum seemed to stop the etch, although the mechanism of protection is not understood. The combined action of the titanium and molybdenum to stop the etching might be similar to the way that a zinc-coating on steel inhibits the corrosion of the steel.

The interface layer combination explains the necessity of the oxygen plasma. A thin layer of 20 nm of titanium would normally oxidize in laboratory air. But the combined titanium/molybdenum layer remained metallic and shorted out the entire circuit, until an oxygen/argon plasma was employed to convert the interface layer to insulator.

Thus, refractory resistors of molybdenum with a titanium etch stop underlayer have been fabricated on superconductor integrated circuits. The molybdenum films can make electrical contact through the titanium layer to the niobium interconnections. Plasma oxidation of the etch stop layer converts it to an insulator, to prevent shorting of isolated components. The etch stop layer protects both niobium and silicon dioxide underlayers from the reactive ion etch plasma. This increased the processing margins for the etch time, to guarantee complete etching of the molybdenum resistors across the entire wafer. In summary, an improved etch stop layer for molybdenum resistors has been found. A 200 Angstrom layer of Ti provides 4 minutes of processing margin in the reactive ion etching of molybdenum resistor films. Titanium is an improvement over the previous use of aluminum etch stop layers, because Ti is a relatively high resistivity material that does not tend to short out the molybdenum film.

The invention is not to be construed as limited to the particular examples described herein as these are to be regarded as illustrative, rather than restrictive. The invention is intended to cover all structures and processes which do not depart from the spirit and scope of the invention.

What we claim is:

1. A method for preparing molybdenum resistors in a superconductor integrated circuit; said method comprising:
    a) depositing superconductor film on a support;
    b) patterning said superconductor film to provide a patterned superconductor and exposed support;
    c) applying an titanium film on said superconductor film and said exposed support;
    d) applying a molybdenum film on said titanium film to provide an titanium-molybdenum, etch-stop interface;
    e) applying a patterned resist film on said molybdenum film to provide exposed molybdenum film and unexposed molybdenum film;
    f) etching said exposed molybdenum film to define the molybdenum resistor and expose a portion of said titanium-molybdenum, etch-stop interface; and
    g) oxidizing said exposed titanium-molybdenum, etch-stop interface, whereby the titanium-molybdenum, etch-stop interface protects the patterned superconductor film and the support and increases processing margins for the etch time.

2. The method of claim 1, wherein said etching of said exposed molybdenum film is by reactive ion etching or plasma etching.

3. The method of claim 2, wherein said etching of said exposed molybdenum film is by reactive ion etching.

4. The method of claim 2, wherein said etching of said exposed molybdenum film is by plasma etching.

5. The method of claim 1, wherein said oxidizing said exposed titanium-molybdenum etch stop interface is by exposing said interface to a plasma containing at least 25 volume percent oxygen.

6. The method of claim 5, wherein said plasma contains 25-75 volume percent oxygen and 25-75 volume percent argon.

7. The method of claim 1, wherein said titanium film is 50-500 Angstroms thick.

8. The method of claim 1, wherein said titanium film is about 150-250 Angstroms thick.

9. A method for preparing molybdenum resistors in a superconductor integrated circuit; said method comprising:
    a) depositing superconductor film on a support;
    b) patterning said superconductor film to provide a patterned superconductor and exposed support;

c) applying film of titanium, zirconium, or hafnium, or mixtures thereof on said superconductor film and said exposed support;

d) applying a molybdenum film on said film of titanium, zirconium, or hafnium, or mixtures thereof to provide an etch-stop interface;

e) applying a patterned resist film on said molybdenum film to provide exposed molybdenum film and unexposed molybdenum film;

f) etching said exposed molybdenum film to define the molybdenum resistor and expose a portion of said etch-stop interface; and g) oxidizing said exposed etch-stop interface, whereby the etch-stop interface protects the patterned superconductor film and the support and increases processing margins for the etch time.

10. The method of claim 9, wherein said film of titanium, zirconium, or hafnium, or mixtures thereof is at least 50 Angstroms thick.

* * * * *